(12) United States Patent
Ho et al.

(10) Patent No.: US 11,664,345 B2
(45) Date of Patent: May 30, 2023

(54) SEMICONDUCTOR PACKAGE ELEMENT

(71) Applicant: PANJIT INTERNATIONAL INC., Kaohsiung (TW)

(72) Inventors: Chung-Hsiung Ho, Kaohsiung (TW); Chih-Hung Chang, Kaohsiung (TW); Chi-Hsueh Li, Tainan (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 24 days.

(21) Appl. No.: 17/353,836

(22) Filed: Jun. 22, 2021

(65) Prior Publication Data

US 2022/0406750 A1 Dec. 22, 2022

(51) Int. Cl.
*H01L 23/00* (2006.01)
*H01L 23/31* (2006.01)
*H01L 21/56* (2006.01)

(52) U.S. Cl.
CPC ............ *H01L 24/96* (2013.01); *H01L 21/561* (2013.01); *H01L 23/3114* (2013.01); *H01L 24/97* (2013.01); *H01L 2224/04105* (2013.01); *H01L 2224/48091* (2013.01); *H01L 2924/014* (2013.01); *H01L 2924/181* (2013.01)

(58) Field of Classification Search
None
See application file for complete search history.

(56) References Cited

U.S. PATENT DOCUMENTS

| 10,134,687 | B1* | 11/2018 | Kim | ......................... H01L 24/73 |
| 2013/0181338 | A1* | 7/2013 | Lu | ........................ H01L 23/3157 |
| | | | | 257/737 |
| 2016/0035663 | A1* | 2/2016 | Huang | .............. H01L 23/49861 |
| | | | | 257/668 |
| 2018/0151478 | A1* | 5/2018 | Chen | ...................... H01L 21/561 |

FOREIGN PATENT DOCUMENTS

TW 202109782 A 3/2021

* cited by examiner

*Primary Examiner* — Jay C Chang
(74) *Attorney, Agent, or Firm* — Winston Hsu (57) ABSTRACT

A semiconductor package element includes a die, a passive layer, a conductive structure and an encapsulation layer. The die includes a first surface, a second surface and a third surface. The second surface is opposite to the first surface. The third surface is connected between the first surface and the second surface. The passive layer is disposed on the first surface and formed with a hole. The conductive structure is electrically coupled to the die through the hole. The encapsulation layer covers the first surface and the third surface of the die, wherein the passive layer is embedded in the encapsulation layer, a portion of the conductive structure is embedded in the encapsulation layer, and the other portion of the conductive structure protrudes from an etched surface of the encapsulation layer, the etched surface is formed by plasma etching.

6 Claims, 8 Drawing Sheets

SEMICONDUCTOR PACKAGE ELEMENT

BACKGROUND OF THE INVENTION

1. Field of the Invention

The present disclosure relates to a semiconductor package element, and more particularly, to a semiconductor package element in which an encapsulating material above a conductive structure is removed by plasma etching to expose the conductive structure.

2. Description of the Prior Art

With the development of miniaturization of semiconductor die, high-end microelectronic packaging technology is developing from lead frame and wire bonding toward bumps.

Figure 1:
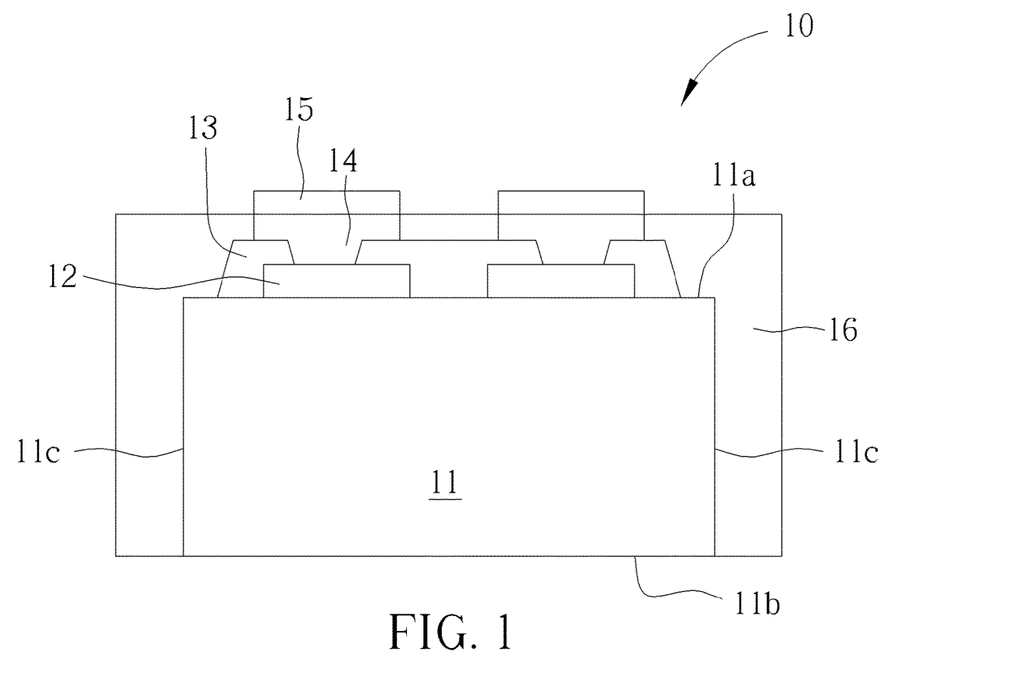
FIG. 1 is a cross-sectional view showing a conventional semiconductor package element with bumps.

Please refer to FIG. 1, which is a cross-sectional view showing a conventional semiconductor package element 10 with bumps 15. The method for manufacturing the semiconductor package element 10 is as follows. First, two metal pads 12, a passive layer 13 and two copper pillars 14 are sequentially formed on a first surface 11a of the die 11, and then the third surface 11c, the first surface 11a, the passive layer 13 and the copper pillars 14 on the first surface 11a of the die 11 are completely encapsulated with an encapsulating material. After the encapsulating material is cured, through a grinding process, such as a chemical mechanical planarization process, the encapsulating material and the copper pillars 14 are grind, such that the encapsulating material and the copper pillars 14 are equal in height and the copper pillars 14 are exposed. Afterwards, bumps 15 are formed on the copper pillars 14, and the remaining encapsulating material is the encapsulation layer 16.

However, during the grinding process, surface burrs, surface scratches and residual stresses may generate on the copper pillar 14, which affects the performance of the semiconductor package element 10. Furthermore, the hardness of copper pillar 14 is high, which will reduce the life of the grinding tool. In addition, the copper pillars 14 need to reserve a height for grinding, which requires a longer process time and higher material costs.

SUMMARY OF THE INVENTION

According to an embodiment of the present disclosure, a semiconductor package element includes a die, a passive layer, a conductive structure and an encapsulation layer. The die includes a first surface, a second surface and a third surface. The second surface is opposite to the first surface. The third surface is connected between the first surface and the second surface. The passive layer is disposed on the first surface and formed with a hole. The conductive structure is electrically coupled to the die through the hole. The encapsulation layer covers the first surface and the third surface of the die, wherein the passive layer is embedded in the encapsulation layer, a portion of the conductive structure is embedded in the encapsulation layer, and the other portion of the conductive structure protrudes from an etched surface of the encapsulation layer. The etched surface is formed by plasma etching.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, etc., is used with reference to the orientation of the Figure (s) being described. As such, the directional terminology is used for purposes of illustration and is in no way limiting. In addition, identical numeral references or similar numeral references are used for identical elements or similar elements in the following embodiments.

According to the present disclosure, when two elements are substantially parallel to each other, it refers that an angle is between the two elements, and the angle is 0±10 degrees. Alternatively, the angle is 180±10 degrees. When two elements are substantially perpendicular to each other, it refers that an angle is between the two elements, and the angle is 90±10 degrees.

Figure 2:
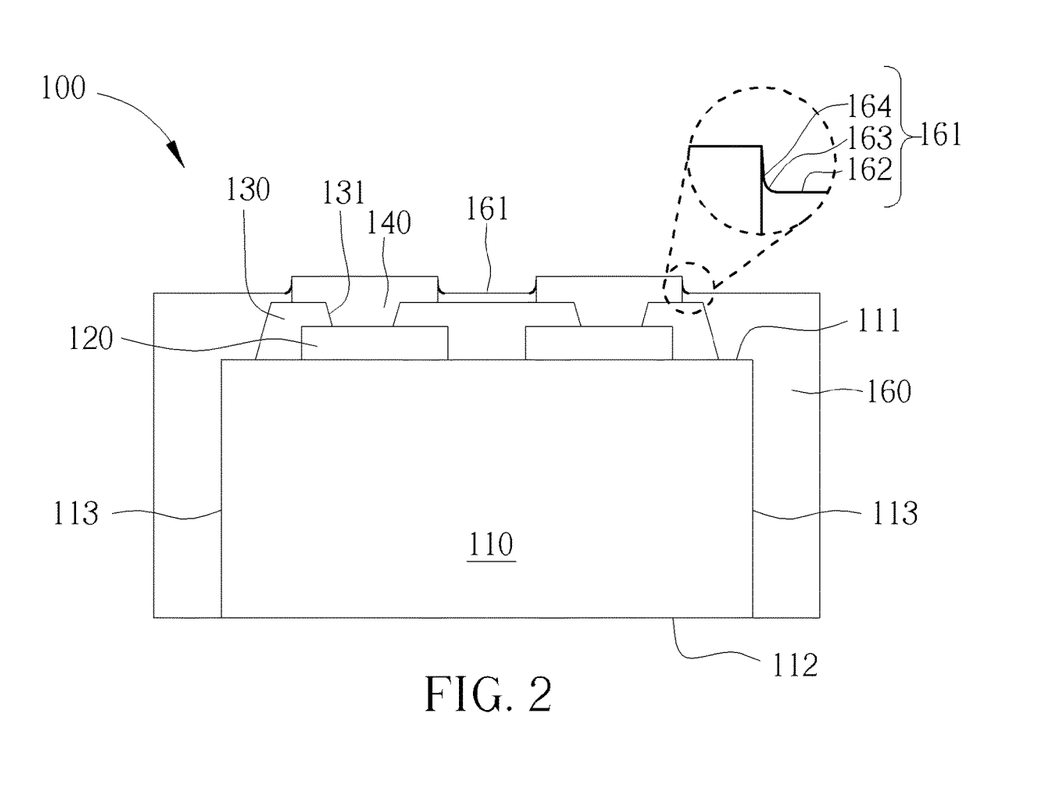
FIG. 2 is a cross-sectional view showing a semiconductor package element according to one embodiment of the present disclosure.

Please refer to FIG. 2, which is a cross-sectional view showing a semiconductor package element 100 according to one embodiment of the present disclosure. The semiconductor package element 100 includes a die 110, a passive layer 130, two conductive structures 140 and an encapsulation layer 160.

The die 110 is a semiconductor die, such as a logic die and a memory die. The die 110 includes a first surface 111, a second surface 112 and a third surface 113. The second surface 112 is opposite to the first surface 111. The third surface 113 is connected between the first surface 111 and the second surface 112. Two metal pads 120 can be disposed on the first surface 111. The metal pads 120, such as aluminum pads, are used as input/output pads (I/O pad) of the die 110.

The passive layer 130 is disposed on the first surface 111 and formed with two holes 131. The material of the passive layer 130 can be epoxy resin or polyimide. The passive layer 130 can be formed on the first surface 111 by spin coating, lamination, etc. The holes 131 can be formed by exposure and development technology.

Each of the conductive structures 140 is electrically coupled to the die 110 through the hole 131. In the embodiment, the conductive structure 140 can be a metal layer and disposed on the metal pad 120 directly. In other embodiment, a re-distribution layer (RDL) can be disposed between the conductive structure 140 and the metal pad 120. The material of the metal layer can be nickel, copper or a combination thereof. The metal layer can be formed by evaporation or sputtering.

The encapsulation layer 160 covers the first surface 111 and the third surface 113 of the die 110, wherein the passive layer 130 is embedded in the encapsulation layer 160, a portion of the conductive structure 140 is embedded in the encapsulation layer 160, and the other portion of the conductive structure 140 protrudes from an etched surface 161 of the encapsulation layer 160. The etched surface 161 is formed by plasma etching. The material of the encapsulation layer 160 can be a dielectric material, such as polypropylene or epoxy molding compound (EMC). With the encapsulation layer 160, the die 110 can be provided with the ability to withstand impact. The phrase "the etched surface 161 is formed by plasma etching" means that the encapsulating material forming the encapsulation layer 160 completely covers the first surface 111 of the die 110, the passive layer 130 and the conductive structures 140 in the beginning, the portion of the encapsulating material above the conductive structure 140 is removed by plasma etching, such that the conductive structure 140 is exposed, and the remaining encapsulating material is the encapsulation layer 160. The surface of the encapsulation layer 160 etched by the plasma is the etched surface 161. Since the plasma etching is directional, the plasma etching has an etching direction (which can refer to an etching direction E in the part (d) of FIG. 5) substantially perpendicular to the first surface 111. The etched surface 161 can include a first etched portion 162, a second etched portion 163 and a third etched portion 164. The third etched portion 164 is connected between the conductive structure 140 and the second etched portion 163. The second etched portion 163 is connected between the third etched portion 164 and the first etched portion 162, i.e., the second etched portion 163 is located between the conductive structure 140 and the first etched portion 162. The first etched portion 162 is substantially perpendicular to the etching direction. The third etched portion 164 is substantially parallel to the etching direction. A cross section of the second etched portion 163 is an arc. That is, a substantially vertical etching contour can be obtained by plasma etching. By using plasma etching to remove the encapsulating material above the conductive structure 140, the drawbacks of the conventional grinding process can be avoided.

Figure 3:
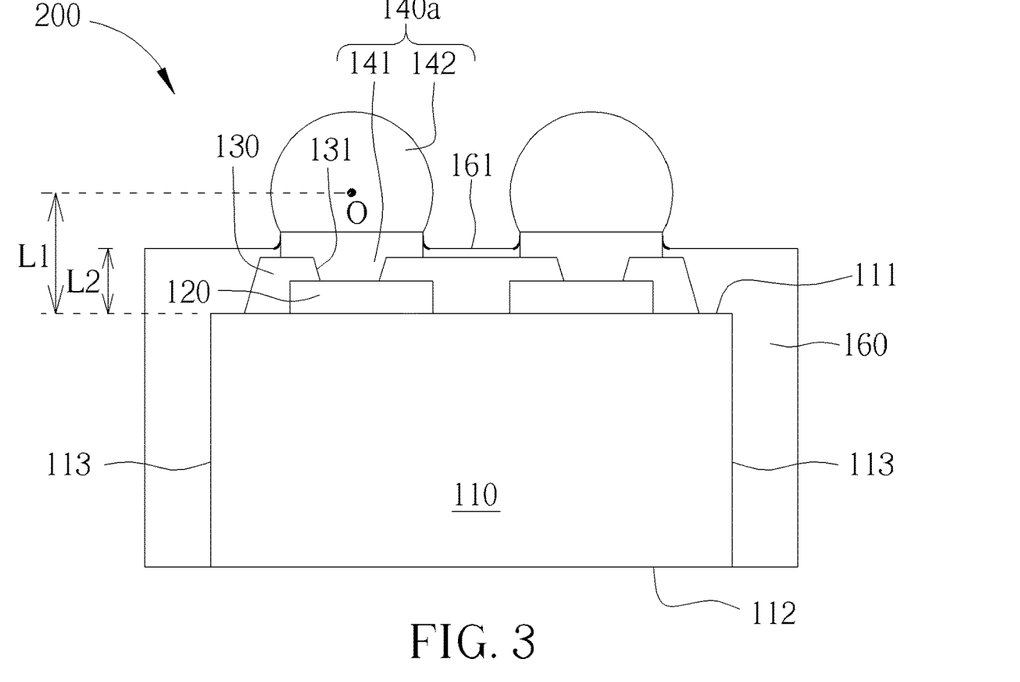
FIG. 3 is a cross-sectional view showing a semiconductor package element according to another embodiment of the present disclosure.

Please refer to FIG. 3, which is a cross-sectional view showing a semiconductor package element 200 according to another embodiment of the present disclosure. Compared with the semiconductor package element 100 in FIG. 2, the conductive structure 140a includes a metal layer 141 (herein, an under-bump metallization layer) and a bump 142. The metal layer 141 is disposed above the first surface 111, and the bump 142 is disposed above the metal layer 141. The bump 142 defines a geometric center O, a distance L1 between the geometric center O and the first surface 111 is greater than a distance L2 between the etched surface 161 and the first surface 111. Herein, the bump 142 is exemplary a solder ball, and the geometric center O is a ball center of the solder ball.

Figure 4:
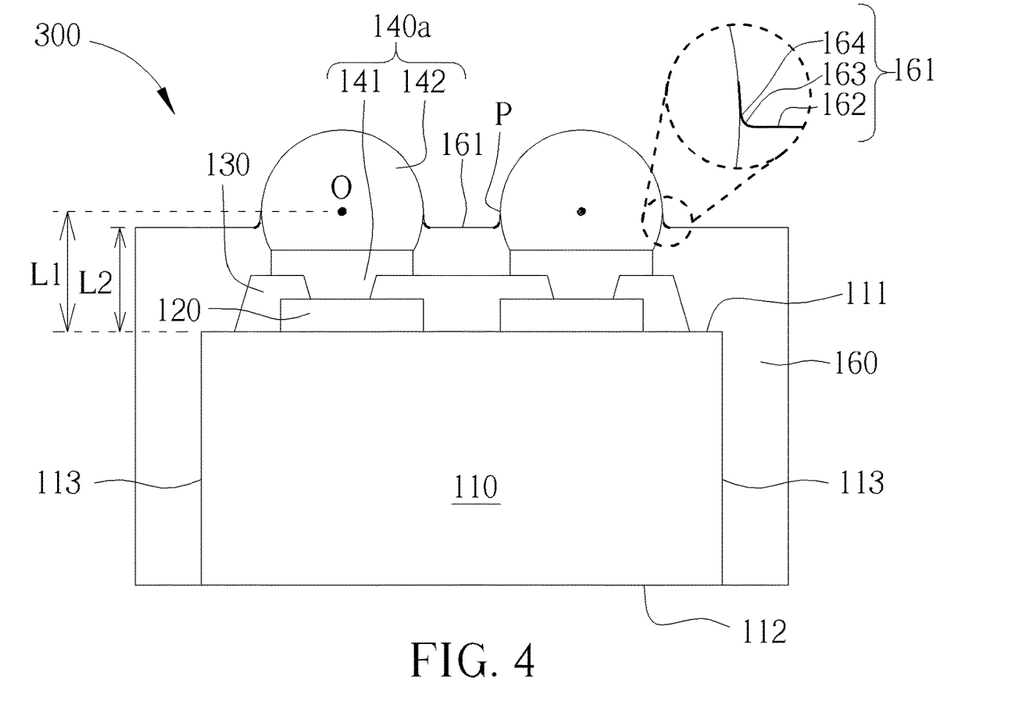
FIG. 4 is a cross-sectional view showing a semiconductor package element according to yet another embodiment of the present disclosure.

Please refer to FIG. 4, which is a cross-sectional view showing a semiconductor package element 300 according to yet another embodiment of the present disclosure. The difference between the semiconductor package element 200 in FIG. 3 and the semiconductor package element 300 in FIG. 4 is the height of the etched surface 161 (herein the height of the etched surface 161 is represented by the height of the first etched portion 162 with larger area). In FIG. 3, the etched surface 161 is aligned with the metal layer 141. In FIG. 4, the etched surface 161 is aligned with the bump 142. Specifically, when manufacturing the semiconductor package element 200, the encapsulation layer 160 can be formed firstly and then the bumps 142 are formed. Therefore, the encapsulation layer 160 does not cover the bumps 142. When manufacturing the semiconductor package element 300, the bumps 142 are formed firstly and then the encapsulation layer 160 is formed. Therefore, the encapsulation layer 160 can encapsulate a portion of the bumps 142. For other details, references can be made to the related description of FIG. 5 to FIG. 10. When each of the bumps 142 is a solder ball, and a distance L1 between the geometric center O (i.e., the ball center) and the first surface 111 is greater than or equal to a distance L2 between the etched surface 161 and the first surface 111, a height of the connection point P of the third etched portion 164 and the solder ball is substantially equal to a height of the ball center. The structural feature is resulted in the etching direction of plasma etching being downward, and the solder ball having a largest lateral length at the ball center. Therefore, the encapsulating material below the point P cannot be etched by the plasma.

Figure 5:
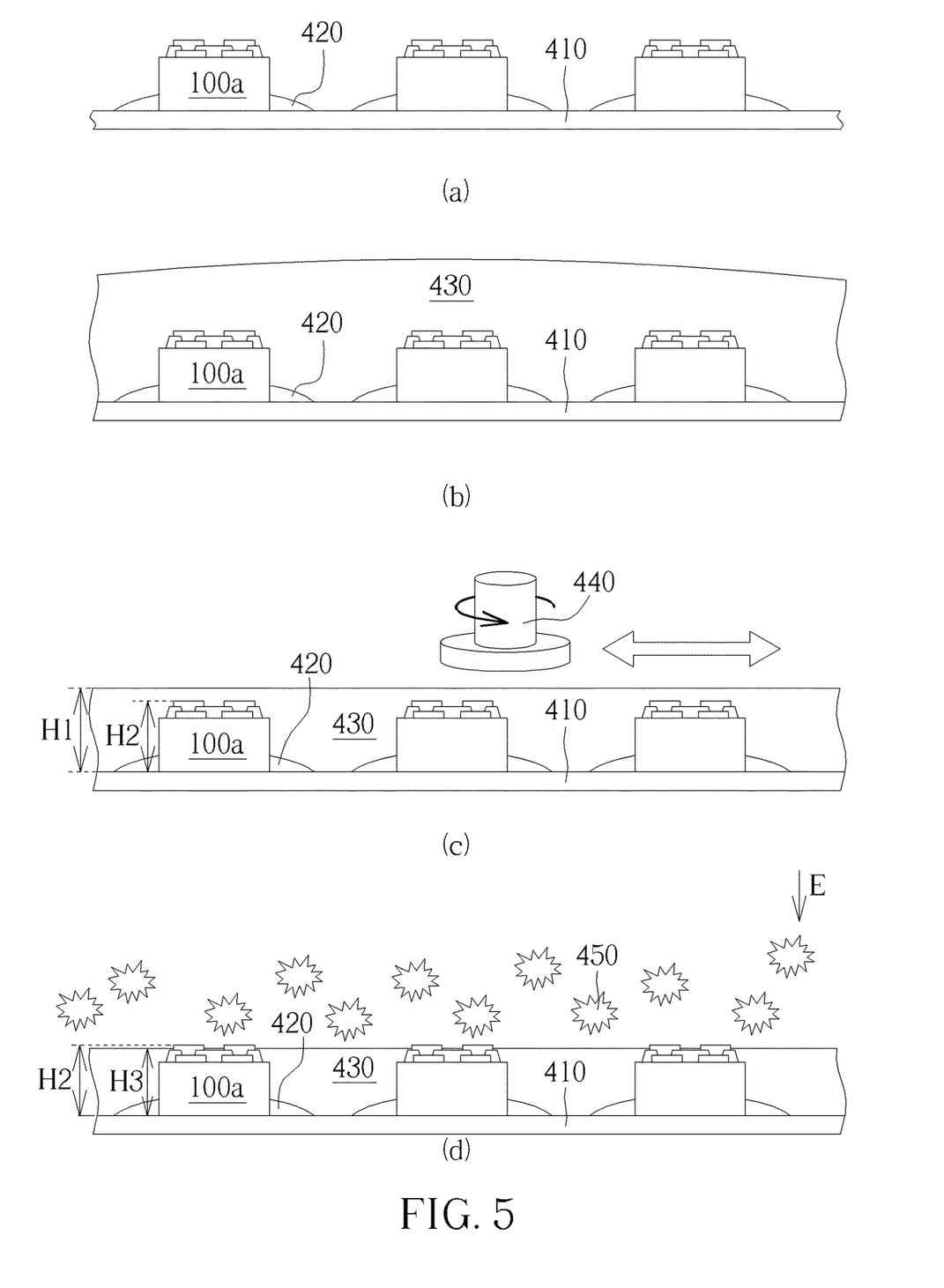
FIG. 5 and FIG. 6 are schematic diagrams showing a manufacturing process of a semiconductor package element according to one embodiment of the present disclosure.
Figure 6:
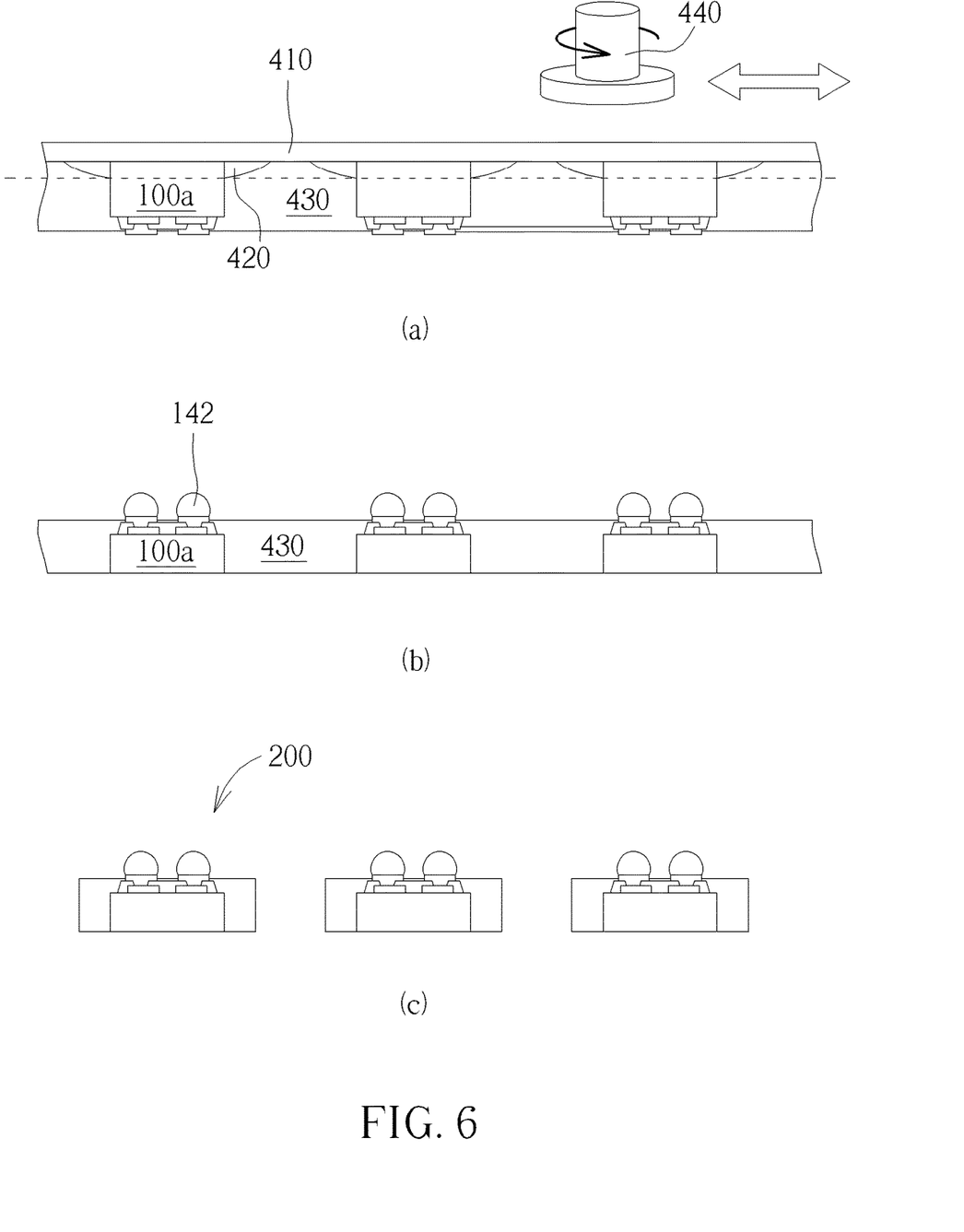

Please refer to FIG. 5 and FIG. 6, which are schematic diagrams showing a manufacturing process of a semiconductor package element according to one embodiment of the present disclosure, and can be applied to manufacture the semiconductor package element 200 in FIG. 3.

In the part (a) of FIG. 5, a plurality of independent and unpackaged first elements 100a are fixed on a substrate 410, such as fixed on the substrate 410 through the glue 420. Each of the first element 100a includes a die 110, two metal pads 120, a passive layer 130 and two metal layers 141 (shown in FIG. 3). The substrate 410 can be a wafer or a panel. The material of the panel can be glass, ceramic or other supporting materials. The shape of the substrate 410 can be an arbitrary shape, such as a circle or a rectangle. In the part (b) of FIG. 5, the first elements 100a are completely encapsulated with the encapsulating material 430, such as by dispensing and printing. Then the encapsulating material 430 is cured. In the part (c) of FIG. 5, a portion of the encapsulating material 430 is initially removed, in which a grinding tool 440 can be used to grind the encapsulating material 430, such that a height H1 of the encapsulating material 430 is slightly higher than a height H2 of the first element 100a. In the part (d) of FIG. 5, a portion of the encapsulating material 430 is removed by plasma etching, such that a height H3 of the encapsulating material 430 is lower than the height H2 of the first element 100a, and the metal layers 141 are exposed. The etching direction E of the plasma 450 E is downward and perpendicular to the first surface 111 or the substrate 410. The gas used in plasma etching depends on the encapsulating material 430. For example, the gas can be oxygen, carbon tetrafluoride, or a combination thereof.

In the part (a) of FIG. 6, the substrate 410 is removed. For example, the substrate 410 can be removed by grinding with the grinding tool 440, and the glue 420 can be removed by further grinding to the dotted line. In the part (b) of FIG. 6, the bumps 142 are formed. The bumps 142 can be formed by a ball drop process. Alternatively, a tin layer can be firstly formed by evaporation, printing, etc., and then a reflow process is performed to obtain the bumps 142 with desired shapes. In the part (c) of FIG. 6, a sawing step is performed, such that a plurality of independent semiconductor package elements 200 are obtained, and the remaining encapsulating material 430 is the encapsulation layer 160. In other embodiment, when the step shown in the part (b) of FIG. 6 is omitted, the semiconductor package element 100 in FIG. 2 can be obtained.

Figure 7:
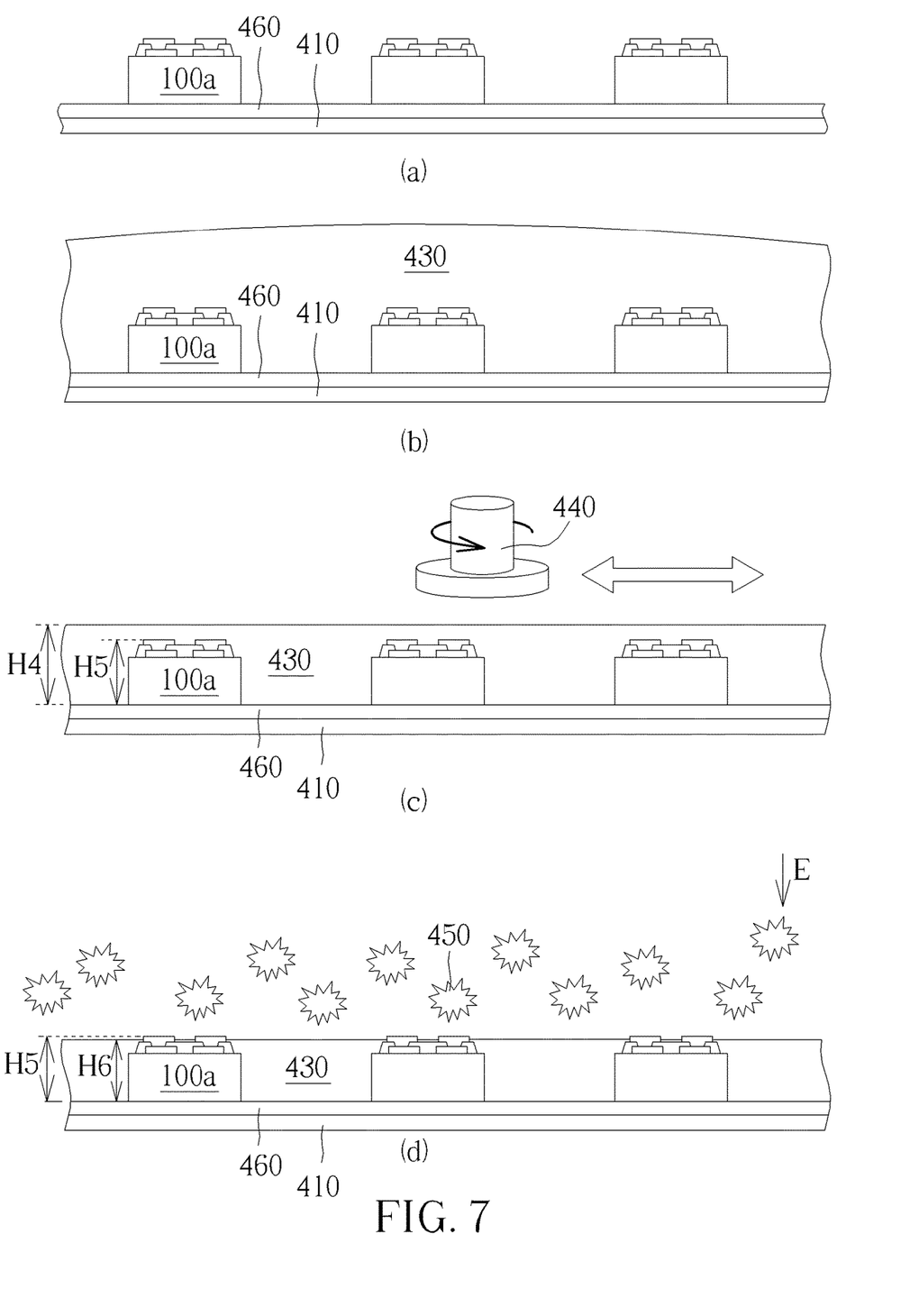
FIG. 7 and FIG. 8 are schematic diagrams showing a manufacturing process of a semiconductor package element according to another embodiment of the present disclosure.
Figure 8:
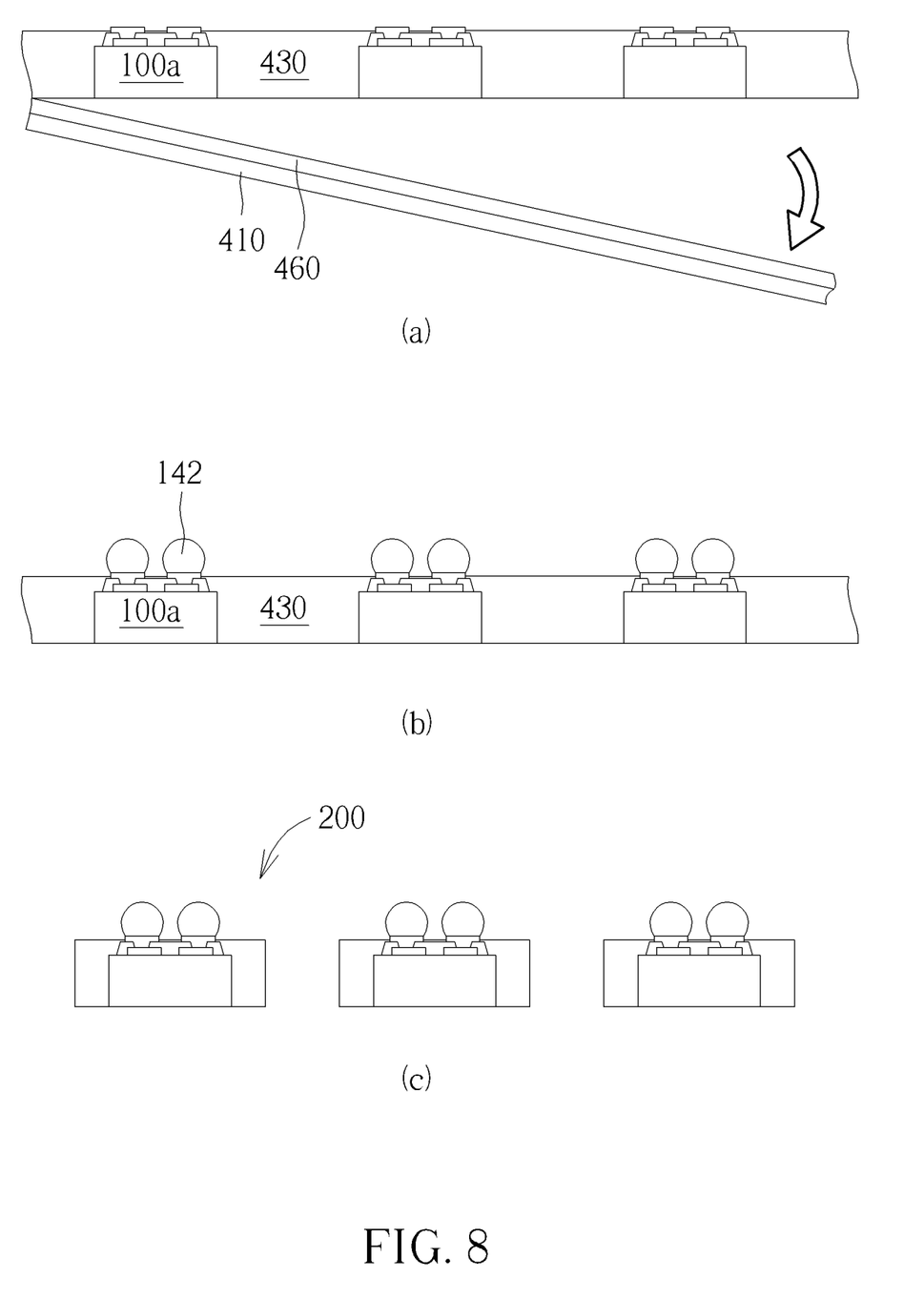

Please refer to FIG. 7 and FIG. 8, which are schematic diagrams showing a manufacturing process of a semiconductor package element according to another embodiment of the present disclosure, and can be applied to manufacture the semiconductor package element 200 in FIG. 3.

In the part (a) of FIG. 7, a plurality of independent and unpackaged first elements 100a are fixed on the substrate 410, such as fixed on the substrate 410 through a thermal release film 460. In the part (b) of FIG. 7, the first elements 100a are completely encapsulated with the encapsulating material 430. In the part (c) of FIG. 7, a portion of the encapsulating material 430 is initially removed, such that a height H4 of the encapsulating material 430 is slightly higher than a height H5 of the first element 100a. In the part (d) of FIG. 7, a portion of the encapsulating material 430 is removed by plasma etching, such that a height H6 of the encapsulating material 430 is lower than the height H5 of the first element 100a, and the metal layers 141 are exposed.

In the part (a) of FIG. 8, the substrate 410 is removed. For example, the viscosity of the thermal release film 460 can be reduced by heating, and the thermal release film 460 together with the substrate 410 can be easily peeled off. In the part (b) of FIG. 8, the bumps 142 are formed. In the part (c) of FIG. 8, a sawing step is performed, such that a plurality of independent semiconductor package elements 200 are obtained. For details of FIG. 7 and FIG. 8, references can be made to the related description of FIG. 5 and FIG. 6.

Figure 9:
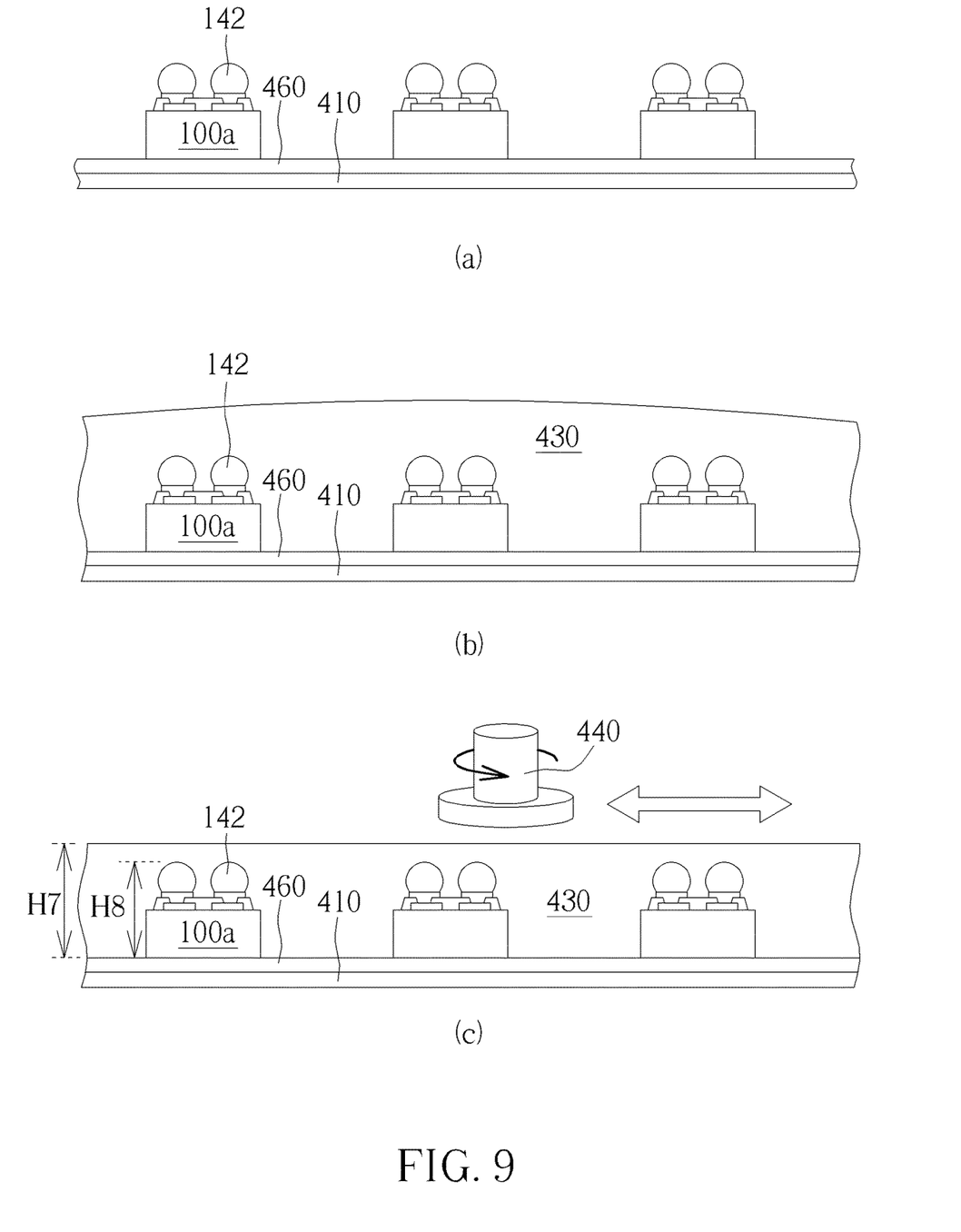
FIG. 9 and FIG. 10 are schematic diagrams showing a manufacturing process of a semiconductor package element according to yet another embodiment of the present disclosure.
Figure 10:
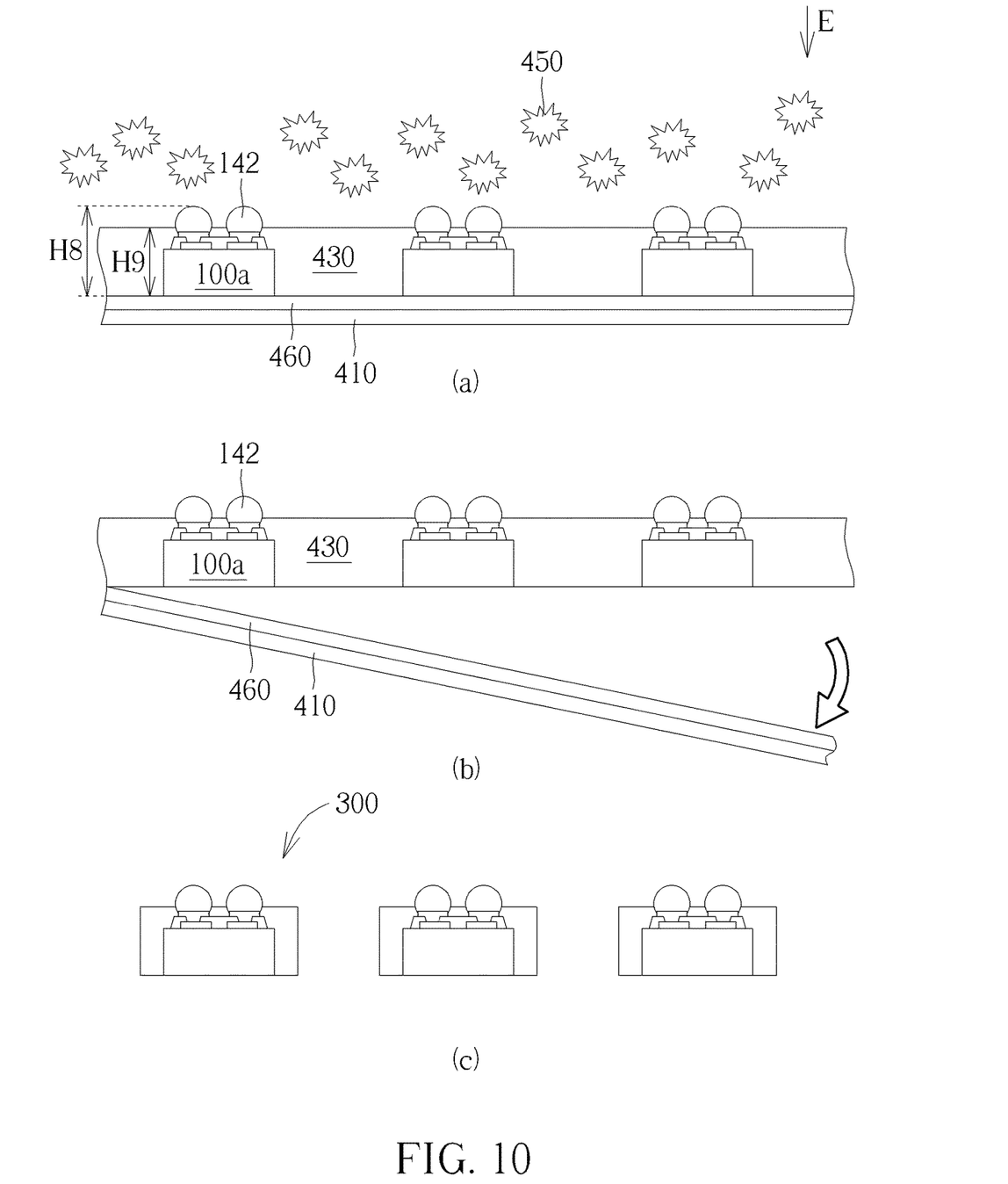

Please refer to FIG. 9 and FIG. 10, which are schematic diagrams showing a manufacturing process of a semiconductor package element according to yet another embodiment of the present disclosure, and can be applied to manufacture the semiconductor package element 300 in FIG. 4. Compared to FIG. 7 and FIG. 8, the bumps 142 are firstly formed on each of the first element 100a in FIG. 9 and FIG. 10. Hereinafter, the combination of the bumps 142 and the first element 110a is called as the second element (not labeled).

In the part (a) of FIG. 9, a plurality of independent and unpackaged second elements are fixed on the substrate 410. In the part (b) of FIG. 9, the second elements are completely encapsulated with the encapsulating material 430. In the part (c) of FIG. 9, a portion of the encapsulating material 430 is initially removed, such that a height H7 of the encapsulating material 430 is slightly higher than a height H8 of the second element.

In the part (a) of FIG. 10, a portion of the encapsulating material 430 is removed by plasma etching, such that a height H9 of the encapsulating material 430 is lower than the height H8 of the second element, and the bumps 142 are exposed. In the part (b) of FIG. 10, the substrate 410 is removed. In the part (c) of FIG. 10, a sawing step is performed, such that a plurality of independent semiconductor package elements 300 are obtained. In the embodiment, since the bumps 142 are formed firstly, and then the encapsulation layer 160 is formed, the encapsulation layer 160 can cover a portion of each of the bumps 142. In addition, the exposed height of each of the bumps 142 can be determined by controlling the parameters of plasma etching. When the depth of plasma etching is deeper, and the height H9 of the encapsulating material 430 is lowered to align with the metal layer 141, the semiconductor package element 200 in FIG. 3 can be obtained. For details of FIG. 9 and FIG. 10, references can be made to the related description of FIG. 5 to FIG. 8.

According to another embodiment of the present disclosure, a method 500 for manufacturing a semiconductor package element is disclosed. The method 500 includes Steps 510 to 580, in which Steps 530, 560 and 570 are optional.

In Step 510, a plurality of independent and unpackaged elements are fixed on a substrate.

In Step 520, the elements are completely encapsulated with an encapsulating material.

In Step 530, a portion of the encapsulating material is removed by a grinding tool.

In Step 540, a portion of the encapsulating material is removed by plasma etching, such that a conductive structure of each of the elements is exposed.

In Step 550, the substrate is removed.

In Step 560, a laser marking step is performed, such that information, such as specifications and manufacturer are indicated on the die.

In Step 570, a plurality of bumps are formed.

In Step 580, a sawing step is performed, such that a plurality of independent semiconductor package elements are obtained.

Compared to the prior art, the semiconductor package element of the present disclosure has advantages as follows.

First, the semiconductor package element has a conductive structure, and does not require the traditional lead frames, substrates and wire bonding, which is beneficial to the development of miniaturization. Second, the encapsulating material above the conductive structure is removed by plasma etching, which can avoid surface burrs, surface scratches and residual stress generated on the conductive structure due to grinding, and can extend the life of the grinding tool. Third, the conductive structure does not need to reserve a height for grinding, which can save process time and material costs. Fourth, according to the present disclosure, a plurality of dies are packaged at the same time then are divided by sawing, which is appliable for wafer level package and panel level package. Fifth, according to the present disclosure, the element is completely encapsulated with an encapsulating material, and then the upper encapsulating material is removed, which is beneficial to improve the structural strength of the package.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package element, comprising:
   a die, comprising:
      a first surface;
      a second surface opposite to the first surface; and
      a third surface connected between the first surface and the second surface;
   a passive layer disposed on the first surface and formed with a hole;
   a conductive structure electrically coupled to the die through the hole, wherein the conductive structure comprises a metal layer and a bump, the metal layer is disposed above the first surface, and the bump is disposed above the metal layer; and an encapsulation layer covering the first surface and the third surface of the die, wherein the passive layer is embedded in the encapsulation layer, a portion of the conductive structure is embedded in the encapsulation layer, another portion of the conductive structure protrudes from an etched surface of the encapsulation layer, the etched surface is formed by plasma etching, the etched surface directly connects a sidewall of the metal layer, the etched surface comprises a first etched portion and a second etched portion, the second etched portion is located between the conductive structure and the first etched portion, and a cross section of the second etched portion is an arc.

2. The semiconductor package element of claim 1, wherein the plasma etching has an etching direction, the first etched portion is substantially perpendicular to the etching direction.

3. The semiconductor package element of claim 2, wherein the etched surface further comprises a third etched portion connected between the conductive structure and the second etched portion, the third etched portion is substantially parallel to the etching direction.

4. The semiconductor package element of claim 1, wherein the bump defines a geometric center, a distance between the geometric center and the first surface is greater than or equal to a distance between the etched surface and the first surface.

5. A semiconductor package element, comprising:
   a die, comprising:
   a first surface;
   a second surface opposite to the first surface; and
   a third surface connected between the first surface and the second surface;
   a passive layer disposed on the first surface and formed with a hole;
   a conductive structure electrically coupled to the die through the hole, wherein the conductive structure comprises a metal layer and a bump, the metal layer is disposed above the first surface, and the bump is disposed above the metal layer; and
   an encapsulation layer covering the first surface and the third surface of the die, wherein the passive layer is embedded in the encapsulation layer, a portion of the conductive structure is embedded in the encapsulation layer, another portion of the conductive structure protrudes from an etched surface of the encapsulation layer, the etched surface is formed by plasma etching, the etched surface directly connects a sidewall of the conductive structure, the bump defines a geometric center, a distance between the geometric center and the first surface is greater than or equal to a distance between the etched surface and the first surface, the bump is a solder ball, the geometric center is a ball center of the solder ball, the etched surface includes a first etched portion, a second etched portion and a third etched portion, the third etched portion is connected between the conductive structure and the second etched portion, the second etched portion is connected between the third etched portion and the first etched portion, and a height of a connection point of the third etched portion and the solder ball is substantially equal to a height of the ball center.

6. A semiconductor package element, comprising:
   a die, comprising:
   a first surface;
   a second surface opposite to the first surface; and
   a third surface connected between the first surface and the second surface;
   a passive layer disposed on the first surface and formed with a hole;
   a conductive structure electrically coupled to the die through the hole, wherein the conductive structure comprises a solder ball; and
   an encapsulation layer covering the first surface and the third surface of the die, wherein the passive layer is embedded in the encapsulation layer, a portion of the conductive structure is embedded in the encapsulation layer, and another portion of the conductive structure protrudes from an etched surface of the encapsulation layer, the etched surface is formed by plasma etching, the etched surface comprises a third etched portion substantially parallel to a normal of the first surface, and a height of a connection point of the third etched portion and the conductive structure is substantially equal to or less than a height of a ball center of the solder ball.

* * * * *